(12) United States Patent
Takemoto et al.

(10) Patent No.: US 7,699,500 B2
(45) Date of Patent: Apr. 20, 2010

(54) LIGHT-EMITTING ELEMENT MOUNTING BOARD, LIGHT-EMITTING ELEMENT MODULE, LIGHTING DEVICE, DISPLAY DEVICE, AND TRAFFIC SIGNAL EQUIPMENT

(75) Inventors: Kyosuke Takemoto, Sakura (JP); Ryuji Suzuki, Sakura (JP); Masakazu Ohashi, Sakura (JP)

(73) Assignee: Fujikura Ltd., Tokyo (JP)

( * ) Notice: Subject to any disclaimer, the term of this patent is extended or adjusted under 35 U.S.C. 154(b) by 97 days.

(21) Appl. No.: 11/950,884

(22) Filed: Dec. 5, 2007

(65) Prior Publication Data
US 2008/0130289 A1    Jun. 5, 2008

Related U.S. Application Data

(63) Continuation of application No. PCT/JP2006/311289, filed on Jun. 6, 2006.

(30) Foreign Application Priority Data

Jun. 7, 2005  (JP) ............... 2005-167492
Jun. 7, 2005  (JP) ............... 2005-167494

(51) Int. Cl.
    *F21V 29/00* (2006.01)
(52) U.S. Cl. .................... 362/294; 362/296.01
(58) Field of Classification Search ............. 362/294, 362/296
    See application file for complete search history.

(56) References Cited

U.S. PATENT DOCUMENTS

| | | | |
|---|---|---|---|
| 4,734,316 A | 3/1988 | Hees et al. | |
| 5,959,316 A * | 9/1999 | Lowery .................. | 257/98 |
| 5,998,925 A | 12/1999 | Shimizu et al. | |
| 6,006,827 A | 12/1999 | Lu | |
| 7,196,459 B2 * | 3/2007 | Morris .................. | 362/294 |
| 7,488,096 B2 * | 2/2009 | Childers et al. .............. | 362/373 |
| 2003/0219919 A1 | 11/2003 | Wang et al. | |
| 2004/0104391 A1 | 6/2004 | Maeda et al. | |
| 2005/0024834 A1 * | 2/2005 | Newby .................. | 361/719 |
| 2005/0073244 A1 * | 4/2005 | Chou et al. ............... | 313/498 |
| 2005/0077616 A1 | 4/2005 | Ng et al. | |
| 2005/0122018 A1 | 6/2005 | Morris | |
| 2008/0013320 A1 * | 1/2008 | Tain et al. ............... | 362/294 |
| 2008/0117637 A1 * | 5/2008 | Chang et al. ............... | 362/294 |
| 2009/0059594 A1 * | 3/2009 | Lin ...................... | 362/294 |

FOREIGN PATENT DOCUMENTS

| | | |
|---|---|---|
| JP | 61-190159 U | 11/1986 |
| JP | 62-84942 U | 5/1987 |
| JP | 62-099166 A | 5/1987 |

(Continued)

*Primary Examiner*—David V Bruce
(74) *Attorney, Agent, or Firm*—Sughrue Mion, PLLC

(57) ABSTRACT

In accordance with the present invention, a light-emitting element mounting board is provided including an enamel layer which covers the surface of a core metal, wherein reflective cup portions for mounting light-emitting elements are provided on one face of the board, and wherein a heat radiating part is formed by at least partially removing the enamel layer on the other face of the board, and exposing the core metal. Further, a light-emitting element module including light-emitting elements mounted thereon, a lighting device including the light-emitting element, a display device, and traffic signal equipment are provided.

20 Claims, 8 Drawing Sheets

FOREIGN PATENT DOCUMENTS

| | | |
|---|---|---|
| JP | 63-107483 U | 7/1988 |
| JP | 64-28886 A | 1/1989 |
| JP | 64-86573 A | 3/1989 |
| JP | 02-100346 | 4/1990 |
| JP | 4-124891 A | 4/1992 |
| JP | 4-129287 A | 4/1992 |
| JP | 4-97367 U | 8/1992 |
| JP | 6-21081 U | 3/1994 |
| JP | 2503778 B2 | 4/1996 |
| JP | 10-98215 A | 4/1998 |
| JP | 2000-208815 A | 7/2000 |
| JP | 2000-214803 A | 8/2000 |
| JP | 2001-44517 A | 2/2001 |
| JP | 2001-044574 A | 2/2001 |
| JP | 2001-111158 A | 4/2001 |
| JP | 2001-332768 A | 11/2001 |
| JP | 2001-332769 A | 11/2001 |
| JP | 2002-084029 A | 3/2002 |
| JP | 2002-232009 A | 8/2002 |
| JP | 2004-179048 A | 6/2004 |
| JP | 2005-79065 A | 3/2005 |
| JP | 2005-175427 A | 6/2005 |
| JP | 2006-086985 A | 3/2006 |
| JP | 2006-147865 A | 6/2006 |
| WO | WO 03/030274 A1 | 4/2003 |

* cited by examiner

LIGHT-EMITTING ELEMENT MOUNTING BOARD, LIGHT-EMITTING ELEMENT MODULE, LIGHTING DEVICE, DISPLAY DEVICE, AND TRAFFIC SIGNAL EQUIPMENT

TECHNICAL FIELD

The present invention relates to a light-emitting element mounting board for mounting multiple light-emitting elements such as light-emitting diodes (hereinafter "LEDs"). In particular, it relates to a light-emitting element mounting board capable of assuring satisfactory heat radiation in the case of high-density mounting of light-emitting elements in applications such as lighting; to a light-emitting element module including the light-emitting elements mounted on the board; and to lighting devices, display devices and traffic signal equipments which include the light-emitting element modules.

BACKGROUND ART

In recent years, LEDs have begun to be used as light sources in lighting applications. As disposition of numerous LEDs and inputs of large amounts of electric power are necessary for use in lighting applications, high-thermal-radiation LED-mounting boards are required.

Conventional LED modules for mounting LEDs on LED-mounting boards adopt a configuration which conducts pattern formation of electrodes on an insulated circuit board composed of glass epoxy resin or the like, which has a reflective part designed for efficient forward reflection of light emitted from the LEDs, which includes the LEDs mounted on the bottom face of the reflective part, and which conducts resin sealing of the LEDs by means of a transparent resin with a high refractive index.

Incidentally, when light is emitted from an LED, there is the problem that the power which does not contribute to light emission is converted to heat, the temperature of the LED rises due to the emitted heat, and the light-emitting efficiency of the LED is reduced. In the case where a circuit board composed of commonly used glass epoxy resin or the like is employed as an LED mounting board for lighting, heat radiation properties are poor, and countermeasures to heat are insufficient.

As a circuit board structure with satisfactory heat radiation properties, for example, the one disclosed in Patent Document 1 has previously been provided. In this Patent Document 1, a structure is adopted where a metal plate for heat radiation is connected to the exposed face of a board interlining in order to enhance the heat radiation properties of the board.

Incidentally, the LED module 150 shown, for example, in FIGS. 9A and 9B, includes a lot of LEDs 152 which are arranged on top of a flat board 151. Through-holes 153 for fastening are formed at the four corners of this board 151.

The LED module 160 shown in FIGS. 10A, 10B and 10C forms a lot of cup structures 162 on the surface of a board 161 in order to enhance the extraction efficiency of the light emitted from the LEDs, and includes LEDs 163 mounted on the bottom of the cup structures 162. Through-holes 164 for fastening are formed at the four corners of this board 161. As an LED module of this type, for example, Patent Document 2 and 3 disclose a lighting device wherein two metal boards are combined, cup-shaped portions are formed at predetermined positions on one of the metal boards, and light-emitting elements are mounted on the bottom of their respective cup-shaped portions.

Illustration of electrodes and the like provided on the board is omitted in FIGS. 9A, 9B, and FIGS. 10A, 10B and 10C.

Patent Document 1: Japanese Unexamined Patent Application, First Publication No. S64-28886

Patent Document 2: Japanese Unexamined Patent Application, First Publication No. 2001-332768

Patent Document 3: Japanese Unexamined Patent Application, First Publication No. 2001-332769

DISCLOSURE OF THE INVENTION

Problems to be Solved by the Invention

However, the technology disclosed in Patent Document 1 is designed to prevent the effects of heat when undertaking high-density mounting of circuit parts such as ICs, and nothing is recorded regarding employment as a lighting device or regarding a device configuration using LEDs.

In the case where a lot of LEDs are mounted on a board, the amount of heat radiation from the LEDs is very large, necessitating improvement of the heat radiation properties of the board. As a high-heat-radiation board, one may cite enameled boards. By using a high-heat-radiation enameled board as the LED mounting board for lighting applications, it is possible to mount a large number of LEDs. However, in the case where higher density LED modules for lighting are configured, it becomes necessary to mount a larger number of LEDs or to use LED elements of high brightness, thereby necessitating further improvement of the heat radiation properties of the enameled board.

Moreover, in LED modules using the cup structure, it is necessary to provide a large number of cup structures 162 on the surface of the board 161 as shown in FIGS. 10A, 10B and 10C in order to mount a large number of LEDs. In this case, as the number of cup structures 162 increases, the state shown in FIG. 11 occurs where material is removed from one face of the board 161, with the result that deviation arises between the central axis of the board and the neutral axis in the thickness direction of the board. As a result, as shown in FIG. 12, warpage 167 occurs on the rear face of the board 161. Moreover, as shown in FIGS. 9A and 9B, warpage may occur even in the case where the front face of the board 151 is flat. Warpage of the board is pronounced in the case where board thickness is thin, in the case where board area is large, and in the lengthwise direction of the board.

This type of board warpage risks to reduce the flatness of the bottom of the cup structures and to render LED mounting operations difficult. There is also the problem that bonding of the LEDs and the board is not fully obtainable, and that they tend to come apart. Furthermore, as shown in FIG. 13, the existence of warpage 167 in the board 161 results in the risk that, even when a radiator 170 is attached to the LED module 160, an interstice 168 may arise between the board 161 and the fastening plate 171 of the radiator 170, making it impossible to obtain full contact between the board 161 and the radiator 170. In such cases, when operating LEDs at high output, or when mounting and operating a large number of LEDs, there is the problem that the amount of heat emitted from the LEDs cannot be efficiently radiated from the fin 172, and the temperature of the LEDs rises, resulting in reduced light emission efficiency, deterioration of life, etc.

Illustration of electrodes and the like provided on the board is omitted in FIG. 11 to FIG. 13.

In order to improve the contact of the LED module 160 and the radiator 170, it would be conceivable to interpose a heat-conductive sheet or grease in the interstice 168. However, in this case, there is the problem that the number of parts increases, and cost rises due to the increase in assembly man-hours.

Means for Solving the Problems

The present invention has been made in light of the foregoing circumstances, and the object of the present invention is to provide an enameled board for mounting light-emitting elements which is capable of maintaining satisfactory heat radiation when light-emitting elements are mounted in high density for applications such as lighting, a light-emitting element module includes light-emitting elements mounted on the board, and a lighting device, display device and traffic signal equipment which have the light-emitting element module.

In order to achieve the aforementioned objectives, a first aspect of the present invention provides a light-emitting element mounting board which is constituted by covering the surface of a core metal with an enamel layer, and which provides reflective cup portions for light-emitting element mounting on one of its faces, wherein a heat radiating part is provided on at least a portion of the face which is not provided with said reflective cup portions by removing the enamel layer and exposing the core metal.

In the light-emitting element mounting board of the present invention, it is preferable to conduct pattern formation of electrodes on the light-emitting element mounting face which is provided with said reflective cup portions.

In the light-emitting element mounting board of the present invention, it is preferable to provide indentations (unevenness) in said heat radiating part.

In the light-emitting element mounting board of the present invention, it is preferable to connect a heat radiating structure having fins to said heat radiating part.

The present invention also provides a light-emitting element module which is constituted by mounting light-emitting elements in said reflective cup portions of said light-emitting element mounting board pertaining to the present invention.

In the light-emitting element module of the present invention, it is preferable that said reflective cup portions be resin sealed with transparent resin.

In the light-emitting element module of the present invention, it is preferable that said reflective cup portions be resin sealed with transparent resin that intermixes fluorescent material.

In the light-emitting element module of the present invention, it is preferable that said light-emitting elements be white light-emitting elements which are configured by combining blue LEDs and yellow light-emitting fluorescent material.

The present invention also provides lighting devices, display devices and traffic signal equipment which have said light-emitting element modules pertaining to the present invention.

In order to solve the aforementioned problems, a second aspect of the present invention provides a light-emitting element mounting board which has a metal substrate and an enamel layer that covers the surface of this metal substrate, wherein said metal substrate has a board body with a flat face on the front side where light-emitting elements are mounted, and a heat radiating part composed of one or more fins projecting from the rear face of this board body.

On the flat face of said metal substrate, it is preferable to form cup structures which reflect the light emitted from the light-emitting elements in a predetermined direction.

Said heat radiating part may be configured from two or more plate-shaped fins. It is preferable that said plate-shaped fins be provided in a mutually parallel manner in the lengthwise direction of the board body. Said heat radiating part may also be configured from two or more pin-shaped fins.

It is preferable that said fins be provided on the positions of the rear side of the mounting positions of the light-emitting elements.

It is preferable that at least one hole be provided in said fins.

The present invention also provides a light-emitting element module constituted by mounting light-emitting elements on the aforementioned light-emitting element mounting board.

EFFECTS OF THE INVENTION

As the light-emitting element mounting board of the first aspect of the present invention adopts a configuration where a heat radiating part is provided by removing a portion of the enamel layer of the enameled board and exposing the core metal, heat radiation is improved compared to a board where the entire surface of the core metal is covered with the enamel layer. As the heat radiating part can efficiently radiate the heat emitted by the light-emitting elements in the case where light-emitting elements are mounted and lighted on this board, temperature increases of the board and light-emitting elements can be inhibited, the light emission efficiency of the light-emitting elements can be maintained at a high level, and reliability over long periods of use can be improved.

As the light-emitting element module of the present invention includes light-emitting elements mounted in the reflective cup portions of said light-emitting element mounting board of the present invention, temperature increases of the board and light-emitting elements can be inhibited, the light emission efficiency of the light-emitting elements can be maintained at a high level, and reliability over long periods of use can be improved.

According to the second aspect of the present invention, by integrally providing fins in the metal substrate, it is possible to improve the flexural rigidity of the board body on which the light-emitting elements are mounted, and to reduce the influences of thermal shrinkage. Consequently, the flatness of the cup structures and the mounting face of the light-emitting elements can be improved, and ease of mounting (mountability) and reliability of the board can be enhanced. Moreover, as it is possible to obtain a light-emitting element module which integrates a radiator, there is no need to insert a heat-conductive sheet or grease, and it becomes possible to decrease the number of parts, and reduce assembly man-hours.

In the case where the present invention is used as a lighting device, the light-emitting faces of the light-emitting elements are disposed toward the underside, and the fins of the radiator are disposed toward the upper side, with the result that the heat on the radiator side easily dissipates into the air due to natural convection, enabling radiation to be efficiently conducted.

In the case where the fins are provided on the rear side of the mounting positions of the light-emitting elements, it is possible to further improve the flatness of the mounting positions compared to the case where the fins are provided in other positions. In particular, in the case where cup structures are provided in order to set the mounting positions of the light-emitting elements, it is also possible to deepen the excavation depth of the cup structures. By this means, the degree of design freedom of the cup structures is improved, and it is possible to achieve improvement of light-emitting properties, light distribution, light-extraction efficiency and the like.

In the case where a hole is provided in the fins, the region provided with a through-hole for fastening the light-emitting element module does not need to be maintained on the board body side, thereby improving the degree of freedom relating to the arrangement of light-emitting elements and the patterning of electric wiring.

DESCRIPTION OF THE REFERENCE NUMERALS

| | |
|---|---|
| 1 | Enameled board for light-emitting element mounting |
| 1A | Reflective cup |
| 2 | Core metal |
| 3 | Enamel layer |
| 4 | Heat radiating part |
| 5 | Electrode |
| 6 | Light-emitting element |
| 7 | Metal wire |
| 8 | Transparent resin |
| 10, 11, 13 | Light-emitting element module |
| 12 | Heat radiating structure |
| 101 | Light-emitting element module |
| 102 | Board body |
| 103 | Fin |
| 104 | Heat radiating part |
| 105 | Flat face |
| 106 | Rear face |
| 111 | Light-emitting element mounting board (enameled board) |
| 112 | Metal substrate |
| 113 | Enamel layer |
| 114 | Cup structure |
| 115 | Light-emitting element |
| 118 | Hole (fastening hole) |

BEST MODE FOR CARRYING OUT THE INVENTION

Below, multiple embodiments of the present invention are described with reference to drawings.

Figure 1:
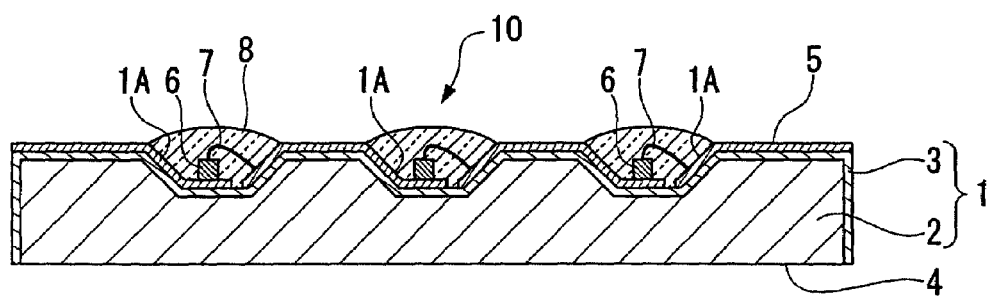
FIG. 1 is a sectional view which shows a first embodiment of the present invention.

FIG. 1 is a sectional view which shows a first embodiment of the present invention. A light-emitting element module 10 (also referred to as an LED module, LED package, etc.) of the present embodiment has an enameled board for light-emitting element mounting 1 which is constituted by an enamel layer 3 covering the surface of a core metal 2 and which is provided on one face (the bottom face of the board in the drawing) with a plurality of reflective cup portions 1A used for light-emitting element mounting, and light-emitting elements 6 which are mounted inside the reflective cup portions 1A of the enameled board for light-emitting element mounting 1. The enameled board for light-emitting element mounting 1 of the present embodiment is provided with a heat radiating part 4 which removes the enamel layer 3 and exposes the core metal 2 on the face that is not provided with the reflective cup portions 1A.

As the material of the core metal 2 composing this enameled board for light-emitting element mounting 1, there are no particular limitations so long as it is a metal which allows the enamel layer 3 to be firmly formed on its surface, and, for example, low-carbon steel sheet or the like may be used. The enamel layer 3 which covers the core metal 2 is formed by the baking of glass powder or the like.

The reflective cup portions 1A which are provided on the light-emitting element mounting face (the top face of the board in the drawing) of this enameled board for light-emitting element mounting 1 are formed into conical shapes composed of a flat bottom and sloped faces. The inclination angle of these sloped faces (the cup angle; the angle constituted by the bottom face and the sloped faces) is on the order of 10 degrees to 90 degrees, and preferably 40 degrees to 90 degrees.

Multiple electrodes 5 which serve to conduct electricity to the light-emitting elements 6 are pattern-formed on the light-emitting element mounting face of this enameled board for light-emitting element mounting 1. These electrodes 5 are formed by printing and baking silver paste or copper paste along suitable electrode patterns or circuit patterns.

In the present embodiment, said heat radiating part 4 is established in a state where the enamel layer 3 of the underside of the enameled board for light-emitting element mounting 1 is removed, and the core metal 2 is exposed. The formation region of this heat radiating part 4 may be part of the underside of the enameled board for light-emitting element mounting 1, or it may be the entire underside as shown in FIG. 1. This heat radiating part 4 may also be extended to the side faces of the board. Furthermore, in the case where the light-emitting element module 10 is attached to a structure which is not illustrated in the drawing, this heat radiating part 4 may be machined so as to conform to the surface shape of the structure, and may be provided with indentations or protrusions (or unevenness) in order to engage with fasteners.

As the light-emitting element 6 mounted on this enameled board for light-emitting element mounting 1, an LED is preferable. In the case where the light-emitting element module 10 is applied in a lighting device, a white LED is preferable as the light-emitting element 6. As this white LED, it is preferable to use, for example, a white LED which combines a blue LED made from a gallium nitride (GaN) semiconductor and one or more types of fluorescent material which is excited by blue light and which emits visible light other than blue such as yellow. It is desirable to use said fluorescent material by mixing and dispersing it in transparent resin 8 which serves to seal the light-emitting elements 6 mounted on the board.

In the light-emitting element module 10 of the present embodiment, each light-emitting element 6 is mounted on the bottom face of a reflective cup 1A. One of the electrode terminals of the light-emitting element 6 is electrically connected to an electrode 5, and the other electrode terminal of the light-emitting element 6 is electrically connected to the other neighboring electrode 5 by metal wire 7 (bonding wire).

Next, a manufacturing method of the aforementioned enameled board for light-emitting element mounting 1 and the light-emitting element module 10 which uses it is described.

First, a low-carbon steel sheet or the like for fabrication of the core metal is prepared, cut out into the appropriate shape, and further machined to form the reflective cup 1A and to fabricate the core metal 2.

Next, said core metal 2 is soaked in a liquid in which glass powder is dispersed in a suitable dispersion medium, a counter electrode is disposed in the vicinity, voltage is impressed between the core metal 2 and the pertinent counter electrode, and the glass powder is electrodeposited on the surface of the core metal 2. After electro-deposition, the core metal 2 is removed from the liquid, dried, inserted into a furnace, and heated in the predetermined temperature range to bake the glass powder on the surface of the core metal 2 and form a thin, uniform enamel layer 3.

Next, the enamel layer 3 on the face where the reflective cup portions 1A are not formed is removed by the sandblasting method or the like, and the core metal 2 is exposed to form the heat radiating part 4. Either before or after formation of said heat radiating part 4, silver paste or copper paste is printed along the electrode formation patterns by a method such as screen printing, and subsequently baked to form the electrodes 5.

By conducting each of the aforementioned processes, the enameled board for light-emitting element mounting 1 shown in FIG. 1 is obtained.

The method of forming said heat radiating part 4 is not limited to the aforementioned exemplification. For example, it is also acceptable to adopt a method where the glass powder is not deposited on the region where the heat radiating part 4 is formed, and where the glass powder is deposited and baked only on the surface apart from this region, a method where the glass powder of the region where the heat radiating part 4 is formed is removed prior to baking, a method where the enamel layer 3 of the region where the heat radiating part 4 is formed is removed by etching, and so on.

Next, the light-emitting elements 6 are mounted by die bonding on the bottom face of the reflective cup portions 1A of the enameled board for light-emitting element mounting 1 fabricated in the aforementioned manner, after which wire bonding is performed, and the respective light-emitting elements 6 and electrodes 5 are electrically connected by the metal wire 7. Subsequently, transparent resin 8 such as epoxy resin or silicon resin, or resin in which fluorescent material compatible with transparent resin is mixed is injected, and hardened to accomplish the resin sealing. By this means, the light-emitting element module 10 shown in FIG. 1 is obtained.

As the enameled board for light-emitting element mounting 1 of the present embodiment adopts a configuration where a heat radiating part 4 is provided by removing part of the enamel layer 3 and exposing the core metal 2, heat radiation properties are improved compared to a board where the entire surface of the core metal 2 is covered with the enamel layer 3, and as the heat emitted from the light-emitting elements 6 in the case where light-emitting elements 6 are mounted on this board and lighted can be efficiently radiated from the heat radiating part 4, temperature increases in the board and light-emitting elements are inhibited, the light-emitting efficiency of the light-emitting elements can be maintained at high levels, and reliability over long periods of use can be improved.

As the light-emitting element module 10 of the present embodiment is constituted by mounting the light-emitting elements 6 in the reflective cup portions 1A of this enameled board for light-emitting element mounting 1, temperature increases in the board and light-emitting elements 6 are inhibited, the light-emitting efficiency of the light-emitting elements 6 can be maintained at high levels, and reliability over long periods of use can be improved.

As stated above, even when the light-emitting element module 10 of the present embodiment includes a lot of light-emitting elements 6 mounted in a densely packed state, as the light-emitting efficiency of the light-emitting elements can be maintained at high levels, and as reliability over long periods of use can be improved, it is useful for various types of lighting devices, display devices, traffic signal equipment, and so on.

Figure 2:
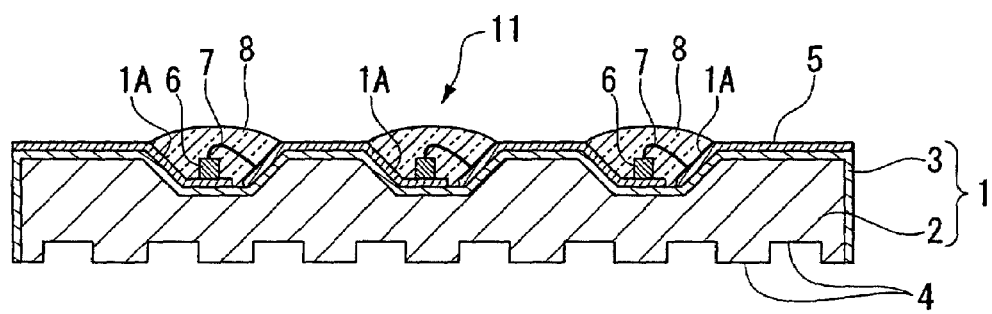
FIG. 2 is a sectional view which shows a second embodiment of the present invention.

FIG. 2 is a sectional view which shows a second embodiment of the present invention. A light-emitting element module 11 of the present embodiment is composed from the same components as the light-emitting element module 10 of the above-described first embodiment, but is characterized by providing indentations in the heat radiating part 4 of the enameled board for light-emitting element mounting 1, and by enlarging the surface area of the heat radiating part 4.

It is desirable that the indentations of this heat radiating part 4 be formed in the heat radiating part 4 to a depth which does not affect the mechanical strength of the enameled board for light-emitting element mounting 1. There are no particular limitations on the shape of these indentations so long as it is capable of enlarging the surface area of the heat radiating part 4. By giving these indentations a groove-like shape in the lengthwise direction or widthwise direction of the board, and by configuring the grooves to allow the flow of air, it is possible to further raise the cooling efficiency of the heat radiating part 4.

The present embodiment is able to obtain the same effects as the above-described first embodiment, and is further able to enlarge the surface area of the heat radiating part 4 and raise heat radiating efficiency by providing indentations in the heat radiating part 4 of the enameled board for light-emitting element mounting 1.

Figure 3:
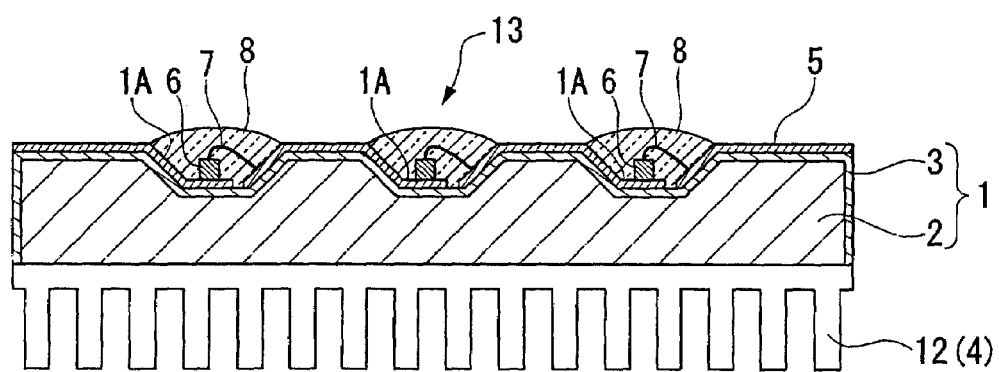
FIG. 3 is a sectional view which shows a third embodiment of the present invention.

FIG. 3 is a sectional view which shows a third embodiment of the present invention. A light-emitting element module 13 of the present embodiment is composed from the same components as the light-emitting element module 10 of the above-described first embodiment, but is characterized by attaching a radiating structure 12 possessing a number of fins to the heat radiating part 4 of the enameled board for light-emitting element mounting 1.

This radiating structure 12 is made of metal with high thermal conductivity such as aluminum, and is provided with a large number of fins in order to increase heat radiation. There are no limitations on the number or dimensions of these fins, but it would be undesirable to make the fins too large, as this would cause the size of the light-emitting element module 10 to become large.

The present embodiment is able to obtain the same effects as the above-described first embodiment, and is further able to increase the radiation efficiency of the heat radiating part 4 by connecting the radiating structure 12 possessing a number of fins to the heat radiating part 4 of the enameled board for light-emitting element mounting 1.

EMBODIMENTS

As the core metal, a low-carbon steel sheet of 100 mm length, 30 mm width and 1.5 mm thickness was used, and the reflective cup portions were formed by drill machining. Seven reflective cup portions were formed in one row at intervals of 14 mm in the lengthwise direction of the core metal, and these were formed in two rows for a total of 14. As for the dimensions of the reflective cup portions, diameter was 2 mm and depth was 0.5 mm, while the sloped parts were made at a 45 degree angle.

Next, liquid in which glass powder was mixed in a dispersion medium and uniformly dispersed was applied to the surface of said core metal, and dried, after which baking was conducted at 850 degrees centigrade (° C.) to form the enamel layer. The thickness of the enamel layer was made to be 200 micrometers (μm), copper paste was applied to the electrode formation region of the face on which the reflective cup portions were formed, and baking was conducted to form electrodes of 0.1 mm thickness, whereby the enameled board was manufactured.

Working Example 1

Sandblasting treatment was performed on the face of said enameled board where the reflective cup portions were not provided, the enamel layer was removed, and treatment was conducted to expose the core metal and form the heat radiating part, as shown in FIG. 1.

As the light-emitting elements, blue LED elements of 20 mW output were mounted in the reflective cup portions of this board. A total of 14 blue LED elements were mounted on said enameled board, and the reflective cup portions were sealed with silicon resin mixed with yellow light-emitting fluorescent powder, whereby white LEDs were made.

When drive current of 60 mA was made to flow into these LED elements to cause light emission, and when the central temperature of the board was measured, the temperature of the central part of the board was 130 degrees centigrade.

Working Example 2

Sandblasting treatment was performed on the face of said enameled board where the reflective cup portions were not provided, the enamel layer was removed, and treatment was conducted to expose the core metal. Next, face where the core metal was exposed was subjected to drill machining, holes with a diameter of 2 mm and depth of 0.2 mm were made, and a heat radiating part was formed as shown in FIG. 2 which was provided with a total of 30 indentations enlarging the surface area of the portion where the core metal was exposed.

As shown in FIG. 2, blue LED elements of 20 mW output were mounted in the reflective cup portions. A total of 14 LED elements were mounted on the enameled board, and the reflective cup portions were sealed with silicon resin mixed with yellow light-emitting fluorescent material, whereby a white LED module was made. When current of 60 mA was made to flow into each LED element to cause light emission, and when the central temperature of the board was measured, the temperature of the central part of the board was 110 degrees centigrade.

Working Example 3

Sandblasting treatment was performed on the face of said enameled board where the reflective cup portions were not provided, the enamel layer was removed, and treatment was conducted to expose the core metal, as shown in FIG. 1. A radiating structure of 10 mm length possessing a number of aluminum fins was attached to the face where the core metal was exposed.

As shown in FIG. 3, blue LED elements with 20 mW output were mounted in the reflective cup portions. A total of 14 LED elements were mounted on the enameled board, and the reflective cup portions were sealed with silicon resin mixed with yellow light-emitting fluorescent material, whereby a white LED module was made. When current of 60 mA was made to flow into each LED element to cause light emission, and when the central temperature of the board was measured, the temperature of the central part of the board was 80 degrees centigrade.

As the radiating fins of the aluminum radiating structure used in this case were large, it was possible to reduce the temperature of the LED elements, but the LED module was large.

COMPARATIVE EXAMPLES

Figure 4:
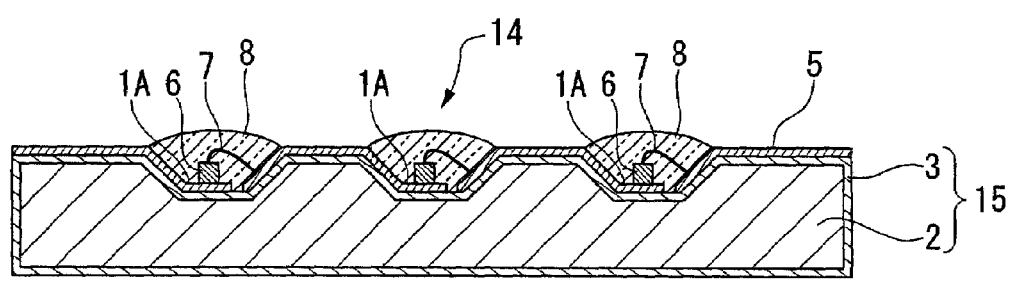
FIG. 4 is a sectional view of a light-emitting element module fabricated in a comparative example.

As shown in FIG. 4, blue LED elements with 20 mW output were mounted in the reflective cup portions using an enameled board for light-emitting element mounting 15 in which the entire surface of the core metal 2 was covered by the enamel layer 3 without conduct of sandblasting treatment. A total of 14 LED elements were mounted on the enameled board, and the reflective cup portions were sealed with silicon resin mixed with yellow light-emitting fluorescent material, whereby a white LED module 14 was made. When current of 60 mA was made to flow into each LED element to cause light emission, and when the central temperature of the board was measured, the temperature of the central part of the board was 150 degrees centigrade, which is a higher temperature than the board of embodiment 1 which was provided with a heat radiating part that exposed the core metal.

Figure 5A:
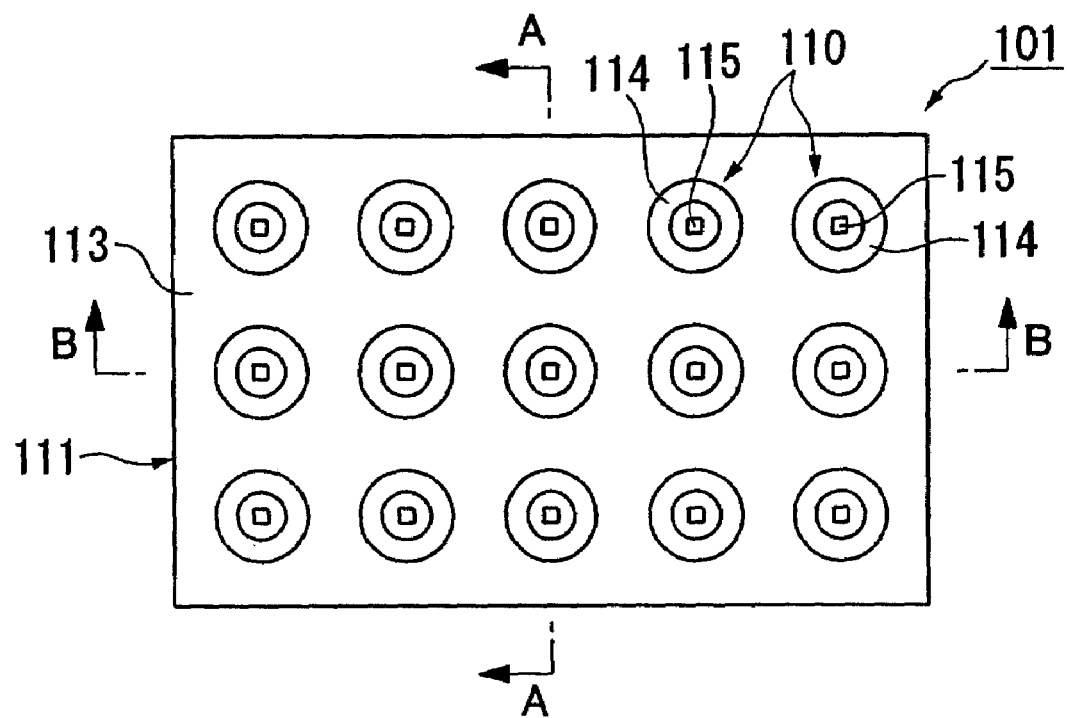
FIG. 5A is a plan view which shows the schematic configuration of a fourth embodiment of the light-emitting element module pertaining to the present invention.
Figure 5B:
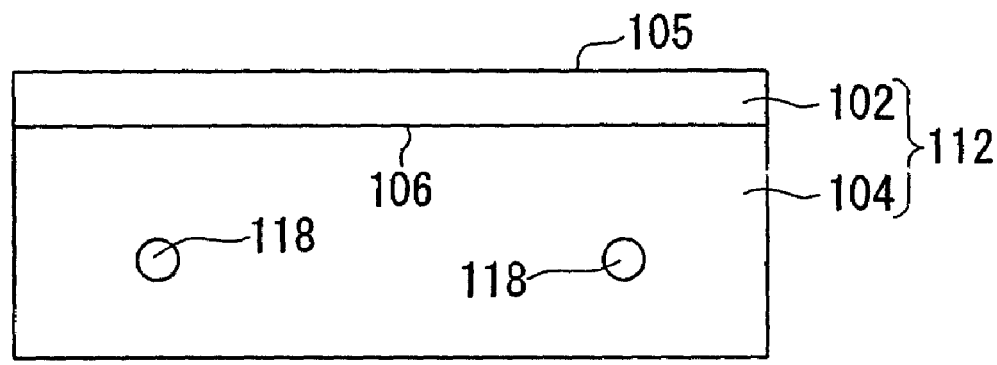
FIG. 5B is a frontal view which shows the schematic configuration of the fourth embodiment of the light-emitting element module pertaining to the present invention.
Figure 5C:
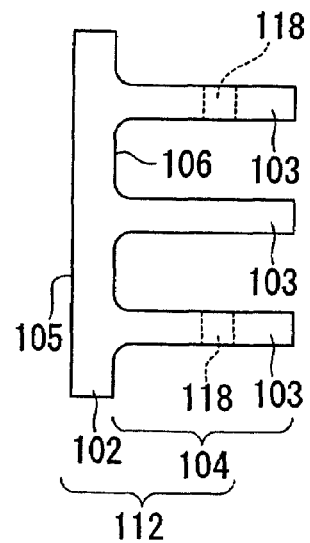
FIG. 5C is a side view which shows the schematic configuration of the fourth embodiment of the light-emitting element module pertaining to the present invention.
Figure 6A:
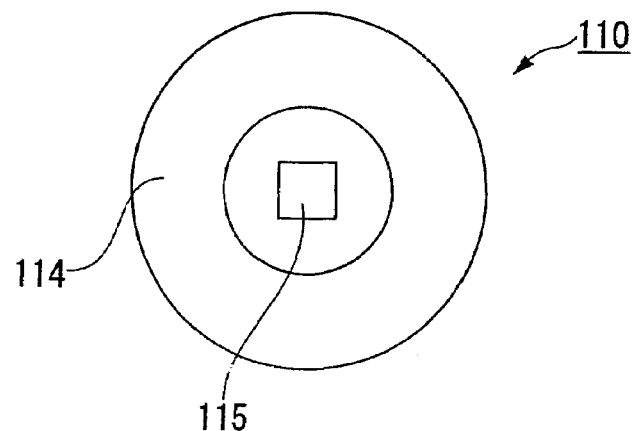
FIG. 6A is a schematic plan view which shows the mounting structure in which the light-emitting element mounted in the cup structure in the light-emitting element module shown in FIG. 5A to FIG. 5C.
Figure 6B:
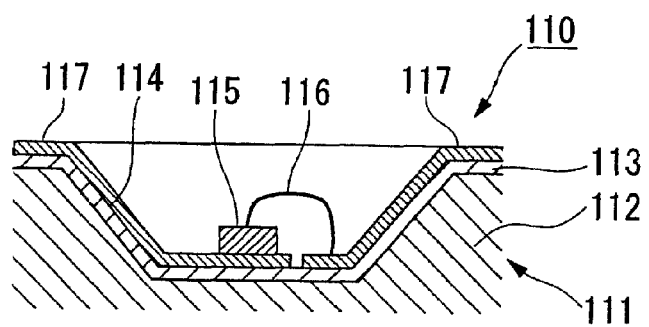
FIG. 6B is a detailed sectional view which shows the mounting structure in which the light-emitting element mounted in the cup structure in the light-emitting element module shown in FIG. 5A to FIG. 5C.
Figure 7A:
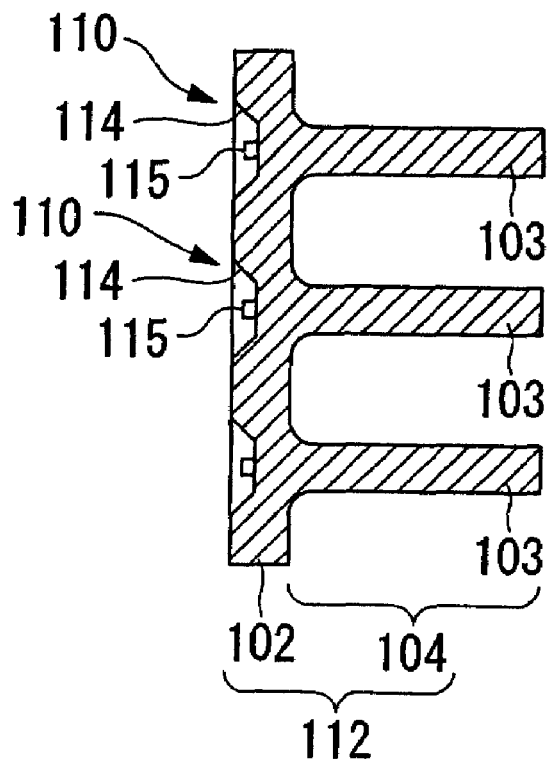
FIG. 7A is a sectional view along line A-A of FIG. 5A.
Figure 7B:
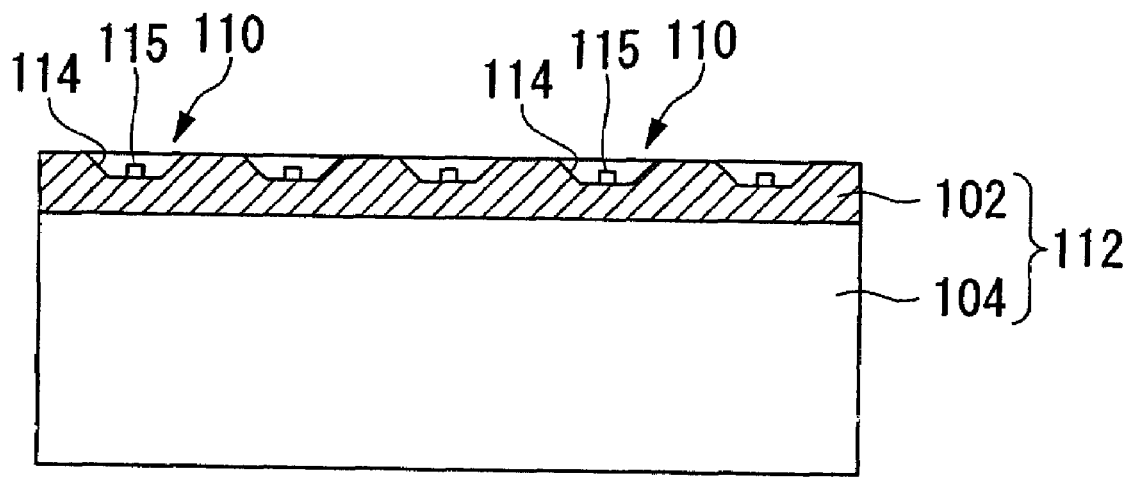
FIG. 7B is a sectional view along line B-B of FIG. 5A.
Figure 8A:
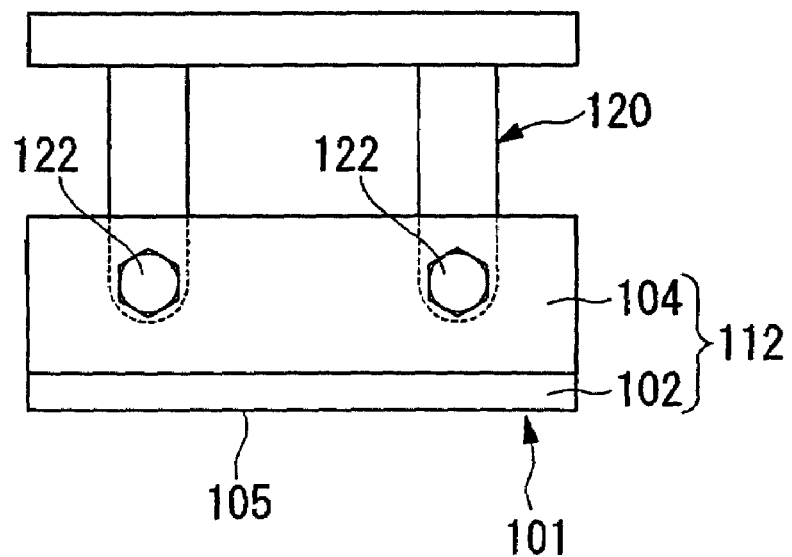
FIG. 8A is a frontal view which shows the state where the light-emitting element module shown in FIG. 5A to FIG. 5C is attached to the body.
Figure 8B:
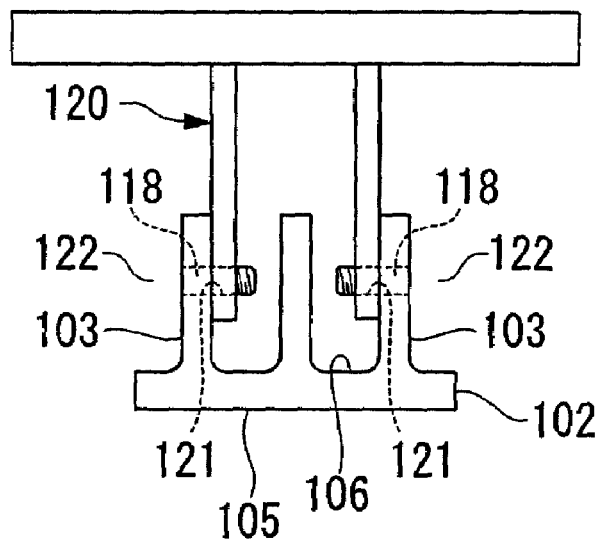
FIG. 8B is a side view which shows the state where the light-emitting element module shown in FIG. 5A to FIG. 5C is attached to the body.
Figure 9A:
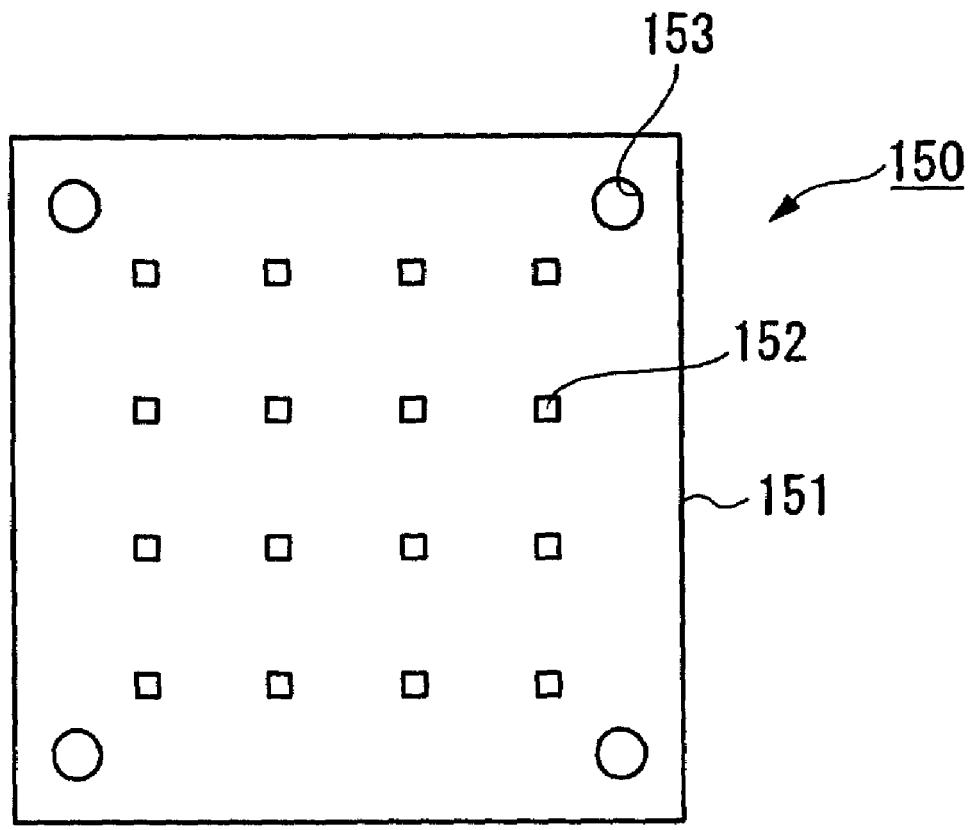
FIG. 9A is a plan view which schematically shows one example of a conventional light-emitting element module.
Figure 9B:
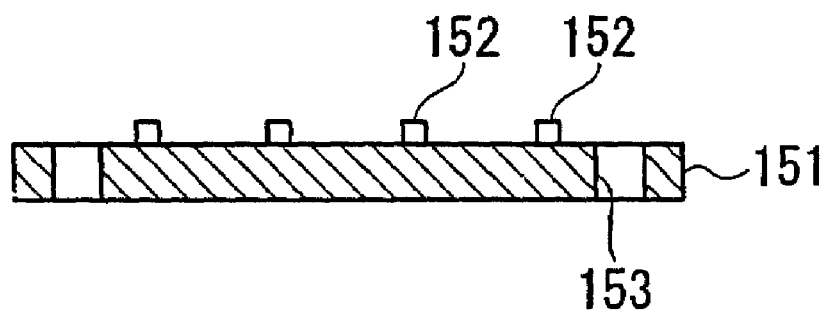
FIG. 9B is a sectional view which schematically shows one example of a conventional light-emitting element module.
Figure 10A:
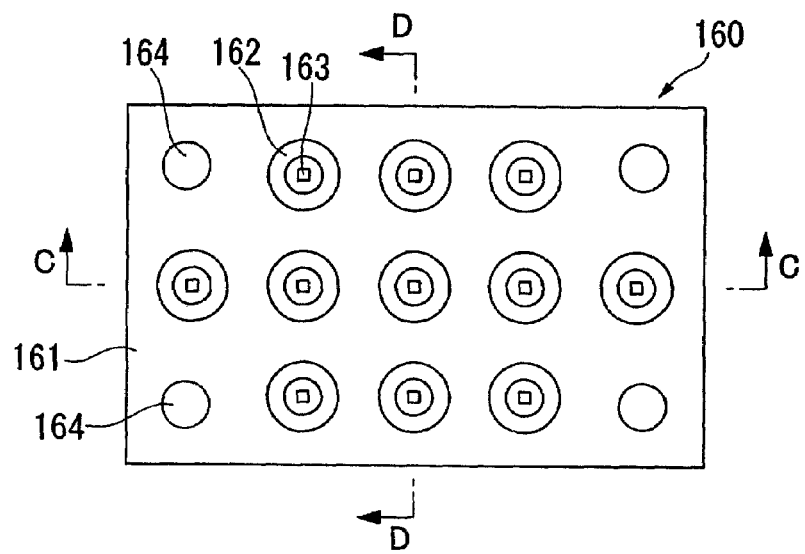
FIG. 10A is a plan view which schematically shows another example of a conventional light-emitting element module.
Figure 10B:
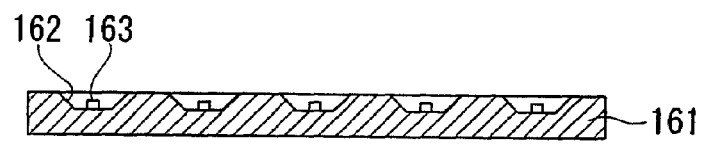
FIG. 10B is a sectional view along line C-C, which schematically shows another example of a conventional light-emitting element module.
Figure 10C:
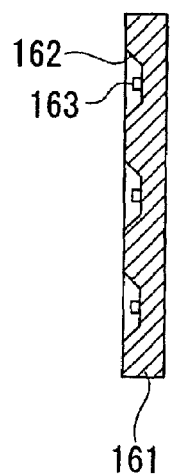
FIG. 10C is a sectional view along line D-D, which schematically shows another example of a conventional light-emitting element module.
Figure 11:
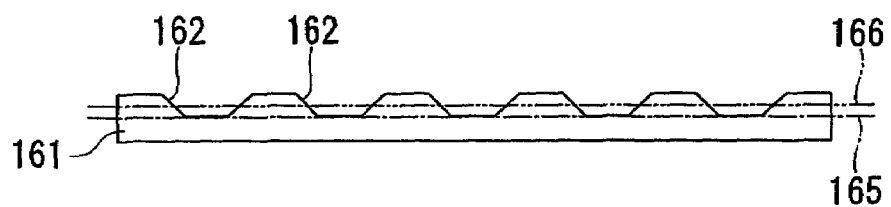
FIG. 11 is a schematic view which serves to explain the slippage of the central axis and neutral axis of the board of the light-emitting element module shown in FIG. 10A to FIG. 10C.
Figure 12:
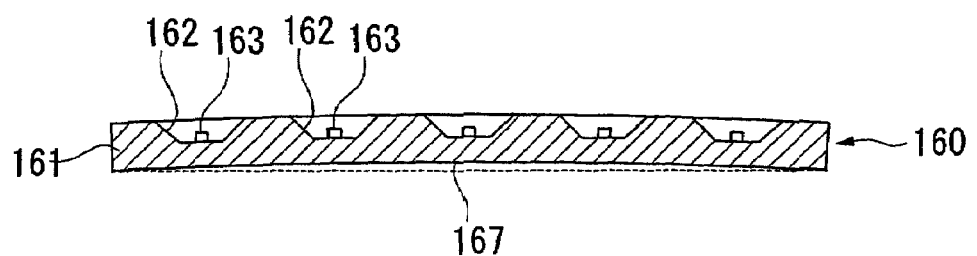
FIG. 12 is a schematic view which serves to explain the warpage of the board of the light-emitting element module shown in FIG. 10A to FIG. 10C.
Figure 13:
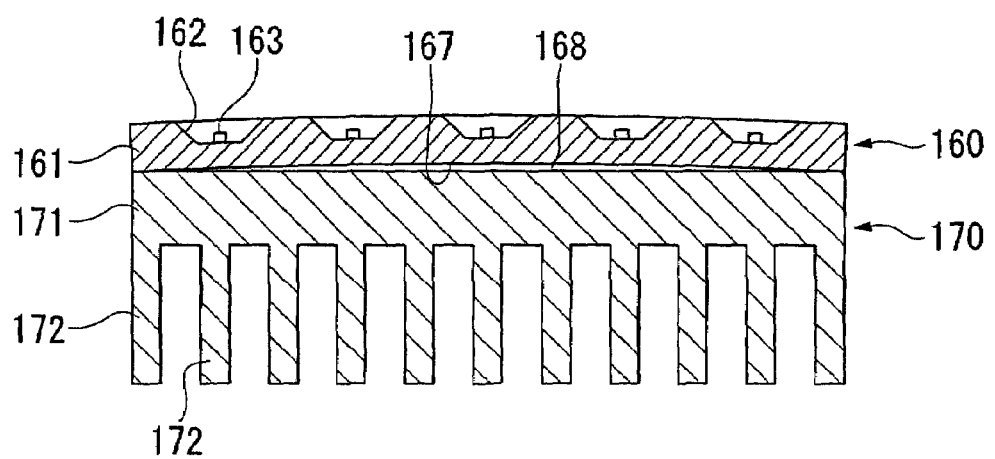
FIG. 13 is a sectional view which shows the state where the board shown in FIG. 12 is attached to a radiator.

FIGS. 5A, 5B and 5C are schematic configurations which show a fourth embodiment of the light-emitting element module of the present invention, where FIG. 5A is a plan view, FIG. 5B is a frontal view, and FIG. 5C is a side view. FIGS. 6A and 6B are drawings of the mounting structure for mounting the light-emitting elements in the reflective cup portions in the light-emitting element module of the present embodiment, where FIG. 6A is a schematic plan view and FIG. 6B is a detailed sectional view. FIG. 7A is a sectional view along line A-A of FIG. 5A, and FIG. 7B is a sectional view along line B-B of FIG. 5A. FIGS. 8A and 8B are drawings which show the state in which the light-emitting element module shown in FIGS. 5A, 5B and 5C is attached to the main body, where FIG. 8A is a frontal view, and FIG. 8B is a side view.

In the respective drawings of FIGS. 5A, 5B and 5C to FIGS. 8A and 8B with the exception of FIG. 6B, illustration of the electrodes and the like provided on the board is omitted.

The light-emitting element module 101 shown in FIGS. 5A, 5B and 5C includes a number of light-emitting elements 115 mounted on a light-emitting element mounting board 111. The light-emitting element mounting board 111 of the present invention uses an enameled board having a metal substrate 112 and an enamel layer 113 which covers the surface of the metal substrate 112 (hereinafter, the light-emitting element mounting board 111 may be referred to as the enameled board 111). The enameled board allows the metal substrate 112 to assume a free form by machining, and enables formation of the enamel layer 113 on the metal substrate 112 which has a surface shape of one's choice, with the result that it is possible to maintain electrical insulation.

The metal substrate 112 is given a shape similar to that of a heat sink. Specifically, it is shaped to have a heat radiating part 104 composed of a board body 102 which has a flat face 105 on the front side where light-emitting elements 115 are mounted, and at least one or more fins 103, 103 which project from a rear face 106 of this board body 102. The board body 102 may also be made to mount the light-emitting elements 115 on the flat face 105, but in order to improve light extraction efficiency, it is preferable to form cup structures 114—which reflect the light emitted from the light-emitting elements 115 in a predetermined direction—on the front side of the board body 102, and to mount the light-emitting elements 115 on the bottom part of these cup structures.

In FIGS. 5A, 5B and 5C, a mounting structure 110 is schematically shown including the light-emitting elements 115 mounted in the cup structures 114. As shown in a detailed manner in FIG. 6B, this mounting structure 110 has the light-emitting element 115 which is mounted on the bottom face of the cup structure 114, a wire bond 116 which connects to the light-emitting element 115, and electrodes 117 and 117 which are provided on the board 111 in a mutually separated state. One of the electrodes 117 and 117 is an electrode to which the light-emitting element 115 is connected by a die bond or the like (not illustrated in the drawing), and the other is an electrode connected to the light-emitting element 115 via a wire bond 116. A board wiring pattern is provided on the flat face 105 of the board body 102 so as to enable driving of the light-emitting elements 115.

In the present embodiment, the cup structures 114 which are the mounting positions where the light-emitting elements 115 are mounted are arranged lengthwise and breadthwise at predetermined intervals on the metal substrate 112. There are no particular limitations on the number in which the mounting positions of light-emitting elements 115 are provided, and one or more is acceptable. There are also no limitations in the present embodiment on the arrangement of the mounting positions of the light-emitting elements 115, which may be designed as appropriate.

As a method of forming the cup structures 114 which are conical depressions on the front side of the board body 102, it is possible to use cutting work which employs a cutting tool such a drill, drawing (plastic forming) by a metal press, polishing which employs a super-hard whetstone, etc. Among these, drawing by metal press is preferable from the standpoints of productivity and processing cost. The bottom face of the cup structure 114 in which a light-emitting element 115 is mounted is a planar face with an area which fully secures the mounting area of the light-emitting element 115. It is preferable that the side faces which encompass the periphery of the bottom face of the cup structure 114 be tapered sloped faces which enlarge the opening area as the surface of the metal substrate 112 is approached.

The metal substrate 112 of the enameled board 111 can be fabricated using various types of metal material, and there are no particular limitations on the material, but it is preferable to use metal material which is inexpensive and easily worked, for example, steel material such as ultralow-carbon steel, low-carbon steel or stainless steel. Japanese Patent No. 2503778 records the conduct of glass treatment on the surface of a copper heat sink, but because copper material is expensive compared to steel material, because workability is poor and formation of precise cup structures with good reproducibility is difficult in the case where material with high heat radiation such as oxygen-free copper is used, and further because copper material has a longitudinal elastic modulus which is half that of steel material, because it has low rigidity resulting in large warpage of the board, it is not suited to the objective of fabricating a board for an LED module.

With respect to the form of the metal substrate 112, in the examples shown in FIGS. 5A, 5B and 5C, the board body 102 is given a rectangular plate shape, and the fins 103 are made in a parallel flat plate, but one is not limited thereto, and the form may be selected at one's discretion according to the application and the like of the light-emitting element module 101. For example, the form of the fins 103 may be a tapered plate shape where thickness decreases toward the tip, and a pin-like shape or the like is also possible. In order to improve the performance of the radiator, it is preferable that the radiator 104 have at least two or more fins 103. It is also acceptable to apply black paint or the like to the surface of the fins 103 to enhance heat radiation properties.

In the case where plate-shaped fins are adopted as the fins 103, 103 . . . , it is preferable to provide the fins 103, 103 . . . in a mutually parallel manner in the lengthwise direction of the board body 102. Here, the lengthwise direction of the board body 102 signifies the direction in which the dimensions along the flat face 105 on the front side of the board body 102 are largest. By this means, it is possible to improve flexural rigidity in the lengthwise direction of the board body 102.

Moreover, it is preferable that the positions at which the fins 103 project be on the rear side of the mounting positions of the light-emitting elements 115. By this means, it is possible to further improve the flatness of the mounting positions compared to the case where the fins 103 project at other positions on the rear face 106 of the board body 102. In particular, in the case where cup structures 114 are provided to serve as the mounting positions of the light-emitting elements 115, it is possible to deepen the excavation depth of the cup structures 114. As a result, the degree of design freedom of the cup structures 114 is improved, and it is possible to achieve improvements with respect to light distribution properties, light extraction efficiency, etc. Consequently, by preparing a blank wherein the surface of the board body 102 has the shape of a flat heat sink, and by forming the cup structures 114 targeting the rear side of the fins 103, it is possible to adopt a layout where the fins 103 and the cup structures 114 face each other on the front and rear of the board body 102.

In the case of the enameled board 111 of the present embodiment, among fins 103, 103 and 103, a through-hole 118 for attachment is provided in the two fins on either side (in two fins with one fin in between, for a total of four). In this manner, by providing attachment holes 118 in the fins 103, there is no need to secure a region on the board body 102 side where through-holes 118 would be provided in order to screw and fasten the light-emitting element module 101 to body parts 120, thereby enabling enhancement of the degree of freedom with respect to the layout and electric wiring pattern of the light-emitting elements 115. The quantity and layout of the through-holes 118 for attachment are not limited to the illustrated embodiment, and may be suitably designed according to the application of the light-emitting element module 101, the structure of the body parts 120, and so on.

In the case of this embodiment, as shown in FIGS. 8A and 8B, a female screw part (screw hole) 121 is provided on the body part 120 side, and the inner face of the through-hole 118 is given a smooth face by using a bolt (male screw) as an attachment member 122. By aligning the positions of the female screw part 121 provided in the body part 120 and the through-hole 118 provided in the fin 103, and by fastening the two with the fastening bolt 122, it becomes possible to conduct attachment to the body part 120 (e.g., a casing).

The holes 118 provided in the fins 103 can assume a variety of forms according to the type of attachment member 122 and the attachment method. For example, it is possible to make it a screw hole which has a female screw, a blind hole which is closed at one end, a hole which has an engaging part and a fitting part on the inside, etc. As other examples of fastening holes which can be applied to the enameled board 111, one may cite the screw hole of the system recorded in Japanese Unexamined Patent Application, First Publication No. H4-129287. The screw hole recorded in the pertinent patent application publication has a groove without an enamel layer placed in between and mutually separating the conductive circuit region of the enameled board and the screw-fastening part of the enameled board, and allows the safety of the circuitry to be assured without having screw-fastening-induced cracking of the enamel layer affect the circuitry.

The material of the enamel layer 113 provided in the surface of the metal substrate 112 may be selected and used from among materials whose main constituent is glass, which have conventionally been employed to form enamel layers in metal surfaces. Among these, alkali-free glass material is preferable. There are no particular limitations on the method of forming the enamel layer 113, and, for example, the following method may be used.

First, the glass powder that serves as the raw material is dispersed in a suitable dispersion medium such as 2-propanol or the like, and the portion of the metal substrate 112 on which one wishes to provide an enamel layer is soaked in the dispersion medium. Furthermore, the electrode that serves as the counter electrode is put into the same dispersion medium, and the glass powder is electrodeposited on the desired surface of the metal substrate 112 as a result of the flow of electricity between the metal substrate 112 and the counter electrode. Subsequently, the enamel layer 113 composed of glass can be made to firmly cover the desired surface of the metal substrate 112 by baking the glass powder in the open air. In order to make the coverage even firmer, one may also subject the surface of the metal substrate 112 (low-carbon steel) to oxidation treatment.

In order to assure electrical insulation, it is sufficient to provide the enamel layer 113 at least on the front side of the board body 102—that is, on the flat face 105—and in the cup structures 114. There are no particular limitations on the thickness of the enamel layer 113, but it is preferable to have a thickness range within 50 micrometer to 200 micrometer with respect to the face having the cup structures 114. With respect to the side faces and rear face 106 of the board body 102, it may be that electrodeposition of the glass is not sufficiently conducted, and that the aforementioned numerical range of thickness is not met, but as mountability of light-emitting elements and insulation are not strictly required with respect to these locations, functionality can be satisfied by sufficiently conducting rustproofing treatment on the metal substrate 112.

There are no particular limitations with respect to the light-emitting elements 115, but semiconductor light-emitting elements such as light-emitting diodes (LEDs) and laser diodes (LDs) may be suitably used. There are no particular limitations on the light-emitting color of the light-emitting elements 115, and blue, green, red or other light-emitting colors are each acceptable. As specific examples, one may cite blue light-emitting elements and green light-emitting elements of nitride compound semiconductors and the like, red light-emitting elements and infrared light-emitting elements represented by gallium phosphide (GaP), and so on. It is also acceptable to configure white LEDs by mounting blue light-emitting elements such as nitride compound semiconductors in the cup structures 114, and incorporating yellow light-emitting fluorescent material that causes blue excitation (e.g., yttrium-aluminum-garnet fluorescent material activated with cerium) in the sealing resin (mentioned below) which seals the cup structures 114. With respect to the incorporated fluorescent material, one is not limited to yellow light-emitting material—green, red or other colors are also acceptable, and, further, mixtures of two or more colors are also acceptable.

In the case where multiple cup structures 114 are provided on the enameled board 111, and where light-emitting elements 115 are mounted in rows, there are no particular limitations on the types or light-emitting colors of the respective light-emitting elements 115. For example, in applications to traffic signal equipment or the like, it is acceptable to provide one light-emitting color with respect to the light-emitting elements 115, while in the case of display devices, it is acceptable to conduct regular or irregular arrangement of LEDs with different light-emitting colors. Furthermore, display devices can be configured by arraying a large number of pixels composed from combinations of blue LEDs, green LEDs and red LEDs on an enameled board 111 of large area. Moreover, flat lighting devices of large area can also be configured using white LEDs as the light-emitting elements 115 by mounting a large number of white LEDs on the enameled board 111 in a crisscross manner.

As the wire bond 116, one may use metal wire composed of gold (Au), etc. With respect to connection of this wire bond 116, bonding may be conducted by employing the wire bonding devices conventionally used in connecting light-emitting elements 115 and the like.

The electrodes 117 provided on the top face of the enameled board 111 may be formed, for example, by conducting spreading with thick-film silver paste from the outside to the inside of the cup structures 114. It is also possible to form the electrodes 117 by press molding copper foil, and attaching it to the cup structures 114.

It is possible to provide sealing resin of high optical transmittance in the cup structure 114 in order to seal the light-emitting element 115 and the connections between the light-emitting element 115 and electrodes 117 when necessary. A suitable transparent resin may be used as the sealing resin, and, as specific examples, one may enumerate thermosetting epoxy resin, ultraviolet-curing epoxy resin, silicon resin, and so on.

With the mounting structure 110 of the light-emitting elements 115 shown in FIGS. 6A and 6B, a structure is adopted where the electrodes 117 are exposed on the flat face 105 which is the top face of the enameled board 111, but it is also acceptable to spread electric insulation material such as resin in order to assure electric insulation of the exposed parts.

In addition, it is also possible to combine lens bodies composed of a transparent medium such as resin or glass as necessary atop the sealing resin or atop the entire light-emitting element module 101.

As described above, according to the light-emitting element mounting board 111 of the present embodiment, by integrally providing fins 103 in the metal substrate 112, it is possible to improve the flexural rigidity of the board body 102 on which the light-emitting elements 115 are mounted, and to reduce the influence of thermal shrinkage. Consequently, it is possible to improve the flatness of the cup structures 114 and the mounting face of the light-emitting elements 115, and to improve the mountability and reliability of the board. Moreover, as it is possible to obtain the light-emitting element module 101 integrated with a heat radiating part 104 that functions as a radiator, there is no need to insert a heat-conductive sheet or grease, and it is possible to reduce the number of parts and decrease assembly man-hours. In the case where the light-emitting element module 101 of the present embodiment is used as a lighting device, the light-emitting faces of the light-emitting elements 115 are disposed on the underside, and the fins 103 of the heat radiating part 104 are disposed on the upper side, with the result that the heat on the heat radiating part side easily dissipates into the air due to natural convection, enabling radiation to be efficiently conducted.

INDUSTRIAL APPLICABILITY

The present invention may be used in various types of products which mount light-emitting elements such as LEDs, for example, lighting devices, display devices, traffic signal equipment, and so on.

The invention claimed is:

1. A light-emitting element mounting board comprising:
a core metal;
an enamel layer which covers the surface of the core metal;
reflective cup portions for mounting light-emitting elements which are provided on one face of the board; and
a heat radiating part which is formed by at least partially removing the enamel layer on the other face of the board, and exposing the core metal.

2. The light-emitting element mounting board according to claim 1, wherein electrodes are pattern formed on the light-emitting element mounting face which is provided with said reflective cup portions.

3. The light-emitting element mounting board according to claim 1, wherein indentations are provided in said heat radiating part.

4. The light-emitting element mounting board according to claim 1, wherein a heat radiating structure which includes fins is connected to said heat radiating part.

5. A light-emitting element module comprising:
the light-emitting element mounting board according to claim 1, and
light-emitting elements mounted in the reflective cup portions of the board.

6. The light-emitting element module according to claim 5, wherein said reflective cup portions are resin sealed with transparent resin.

7. The light-emitting element module according to claim 5, wherein said reflective cup portions are resin sealed with transparent resin that intermixes fluorescent material.

8. The light-emitting element module according to claim 7, wherein said light-emitting elements include white light-emitting elements which are configured by combining blue light-emitting diodes and yellow light-emitting fluorescent material.

9. A lighting device which comprises the light-emitting element module according to claim 5.

10. A display device which comprises the light-emitting element module according to claim 5.

11. Traffic signal equipment which comprises the light-emitting element module according to claim 5.

12. A light-emitting element mounting board comprising:
(i) a metal substrate which comprises a board body with a flat face on the front side where light-emitting elements are mounted, and a heat radiating part composed of one or more fins projecting from the rear face of this board body;
(ii) an enamel layer which covers at least the front side of said metal substrate.

13. The light-emitting element mounting board according to claim 12, wherein cup structures are formed which reflect the light emitted from the light-emitting elements in a predetermined direction.

14. The light-emitting element mounting board according to claim 12, wherein said heat radiating part is configured from at least two plate-shaped fins.

15. The light-emitting element mounting board according to claim 14, wherein said plate-shaped fins are provided in a mutually parallel manner in the lengthwise direction of the board body.

16. The light-emitting element mounting board according to claim 12, wherein said heat radiating part is configured from at least two pin-shaped fins.

17. The light-emitting element mounting board according to claim 14, wherein said fins are provided on the rear side of the mounting positions of the light-emitting elements.

18. The light-emitting element mounting board according to claim 14, wherein at least one hole is provided in said fins.

19. A light-emitting element module comprising:
the light-emitting element mounting board according to claim 12, and
light-emitting elements mounted on the board.

20. The light-emitting element mounting board according to claim 13, wherein the fins and the cup structures face each other on the front and rear faces of the board body.

* * * * *